(12) United States Patent
Wang et al.

(10) Patent No.: US 12,325,223 B2
(45) Date of Patent: Jun. 10, 2025

(54) COVER PLATE AND METHOD FOR MANUFACTURING THE SAME, AND DISPLAY DEVICE

(71) Applicant: BOE TECHNOLOGY GROUP CO., LTD., Beijing (CN)

(72) Inventors: Haoran Wang, Beijing (CN); Paoming Tsai, Beijing (CN); Shuang Du, Beijing (CN); Jiahao Zhang, Beijing (CN); Hong Zhu, Beijing (CN); Xiongnan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 829 days.

(21) Appl. No.: 17/359,965

(22) Filed: Jun. 28, 2021

(65) Prior Publication Data

US 2021/0402736 A1 Dec. 30, 2021

(30) Foreign Application Priority Data

Jun. 28, 2020 (CN) .......................... 202010598718.0

(51) Int. Cl.
*B32B 7/12* (2006.01)
*B32B 7/022* (2019.01)
*B32B 25/08* (2006.01)
*B32B 25/14* (2006.01)
*B32B 25/20* (2006.01)
(Continued)

(52) U.S. Cl.
CPC ................ *B32B 7/12* (2013.01); *B32B 7/022* (2019.01); *B32B 25/08* (2013.01); *B32B 25/14* (2013.01); *B32B 25/20* (2013.01); *H10H 20/8506* (2025.01); *H10K 50/84* (2023.02); *B05D 2252/10* (2013.01); *B32B 2307/412* (2013.01); *B32B 2307/54* (2013.01);
(Continued)

(58) Field of Classification Search
CPC ........ H10K 50/84; H10K 59/87; H01L 33/48; H01L 33/483
See application file for complete search history.

(56) References Cited

U.S. PATENT DOCUMENTS

2017/0271616 A1* 9/2017 Choi ...................... H10K 50/87
2017/0294620 A1* 10/2017 Park ..................... H10K 59/873
(Continued)

FOREIGN PATENT DOCUMENTS

| CN | 106154675 | 11/2016 |
|---|---|---|
| CN | 107545848 | 1/2018 |

(Continued)

OTHER PUBLICATIONS

Machine Translation of CN 208589222 (Year: 2019).*
Chinese First Office Action (w/ English translation) for corresponding CN Application No. 202010598718.0, 18 Pages.

*Primary Examiner* — Zachary M Davis
(74) *Attorney, Agent, or Firm* — Dority & Manning, P.A.

(57) ABSTRACT

A cover plate includes a transparent elastomer layer, a spacer layer and a low surface energy layer. The transparent elastomer layer is made of at least one elastomer material. The low surface energy layer is disposed at a side of the transparent elastomer layer. A surface energy of the low surface energy layer is less than a surface energy of the transparent elastomer layer. The spacer layer is disposed between the transparent elastomer layer and the low surface energy layer.

18 Claims, 11 Drawing Sheets

(51) Int. Cl.
  *H10H 20/85*   (2025.01)
  *H10K 50/84*   (2023.01)
  *H10K 59/80*   (2023.01)

(52) U.S. Cl.
  CPC ... *B32B 2307/732* (2013.01); *B32B 2457/206* (2013.01); *H10K 59/87* (2023.02)

(56) References Cited

U.S. PATENT DOCUMENTS

| | | | |
|---|---|---|---|
| 2018/0212170 A1 | 7/2018 | Shin et al. | |
| 2019/0348630 A1* | 11/2019 | Jung | B32B 37/12 |
| 2020/0386917 A1* | 12/2020 | Hashimoto | H10K 50/844 |
| 2021/0065589 A1 | 3/2021 | Wang et al. | |

FOREIGN PATENT DOCUMENTS

| | | |
|---|---|---|
| CN | 207851465 | 9/2018 |
| CN | 109448542 | 3/2019 |
| CN | 208589222 | 3/2019 |
| CN | 110647213 | 1/2020 |
| CN | 210109507 | 2/2020 |
| CN | 111128031 | 5/2020 |
| TW | 201940022 | 10/2019 |

* cited by examiner

COVER PLATE AND METHOD FOR MANUFACTURING THE SAME, AND DISPLAY DEVICE

CROSS-REFERENCE TO RELATED APPLICATION

This application claims priority to Chinese Patent Application No. 202010598718.0, filed on Jun. 28, 2020, which is incorporated herein by reference in its entirety.

TECHNICAL FIELD

The present disclosure relates to the field of display technologies, and in particular, to a cover plate and a method for manufacturing the same, and a display device.

BACKGROUND

With the development of the technology of flexible display products, bending of the flexible display products will develop in a direction of larger deformation amount and more degrees of freedom. For example, a flexible display product may develop from a product that is deformed uniaxially in a specific area and is in a folded state to a product that is deformed uniaxially in all areas and is in a curled state; and the stretchability of the flexible display product may also develop from a uniaxial stretchable state to a multiaxial stretchable state.

SUMMARY

In one aspect, a cover plate is provided. The cover plate includes a transparent elastomer layer, a spacer layer and a low surface energy layer. The transparent elastomer layer is made of at least one elastomer material. The low surface energy layer is disposed at a side of the transparent elastomer layer. A surface energy of the low surface energy layer is less than a surface energy of the transparent elastomer layer.

The spacer layer is disposed between the transparent elastomer layer and the low surface energy layer.

In some embodiments, a Young's modulus of the transparent elastomer layer is in a range of 0.001 GPa to 3 GPa.

In some embodiments, a thickness of the transparent elastomer layer is in a range of 0.05 mm to 0.5 mm.

In some embodiments, a material of the transparent elastomer layer includes transparent silicone rubber and/or transparent urethane rubber.

In some embodiments, a contact angle of the low surface energy layer is in a range of 1° to 110°.

In some embodiments, a thickness of the low surface energy layer is in a range of 0.1 μm to 20 μm.

In some embodiments, a material of the low surface energy layer includes a fluorine-containing polymer material and/or a silicon-containing polymer material.

In some embodiments, a thickness of the spacer layer is in a range of 1 μm to 50 μm.

In some embodiments, a material of the spacer layer includes non-elastomeric rubber and/or transparent polyethylene terephthalate.

In some embodiments, the cover plate further includes an adhesive layer. The adhesive layer is disposed between the transparent elastomer layer and the spacer layer.

In some embodiments, a peeling force between the adhesive layer and the transparent elastomer layer is in a range of 500 gf/inch to 3000 gf/inch.

In some embodiments, a peeling force between the adhesive layer and the spacer layer is in a range of 500 gf/inch to 3000 gf/inch.

In some embodiments, the cover plate has a display area and a border area located outside the display area. The cover plate further includes at least one light-shielding layer located in the border area.

In some embodiments, the transparent elastomer layer, the low surface energy layer and the spacer layer are located in both the display area and the border area. The at least one light-shielding layer includes one light-shielding layer. The light-shielding layer is disposed on a surface of the transparent elastomer layer away from the low surface energy layer, or the light-shielding layer is disposed on a surface of the transparent elastomer layer proximate to the low surface energy layer, or the light-shielding layer is disposed on a surface of the spacer layer away from the low surface energy layer.

In some embodiments, the transparent elastomer layer, the low surface energy layer and the spacer layer are located in both the display area and the border area. The at least one light-shielding layer includes two light-shielding layers. The two light-shielding layers are disposed on surfaces of the transparent elastomer layer proximate to and away from the low surface energy layer, or the two light-shielding layers are disposed on a surface of the transparent elastomer layer away from the low surface energy layer and a surface of the spacer layer away from the low surface energy layer, or the two light-shielding layers are disposed on a surface of the transparent elastomer layer proximate to the low surface energy layer and a surface of the spacer layer away from the low surface energy layer.

In some embodiments, the transparent elastomer layer, the low surface energy layer and the spacer layer are located in both the display area and the border area. The at least one light-shielding layer includes three light-shielding layers; one of the three light-shielding layers is disposed on a surface of the spacer layer away from the low surface energy layer, and another two of the three light-shielding layers are displayed on surfaces of the transparent elastomer layer proximate to and away from the low surface energy layer.

In another aspect, a display device is provided. The display device includes a display panel and a cover plate as described in any of the above embodiments. The cover plate is disposed on a light-exit side of the display panel.

In yet another aspect, a method for manufacturing the cover plate as described in any of the above embodiments is provided. The method includes: forming the spacer layer; forming the low surface energy layer on a first surface of the spacer layer; forming the transparent elastomer layer, and attaching a first surface of the transparent elastomer layer to a second surface of the spacer layer to obtain the cover plate. The first surface and the second surface of the spacer layer are opposite to each other.

In some embodiments, before attaching the first surface of the transparent elastomer layer to the second surface of the spacer layer, the method further includes: forming an adhesive layer on the second surface of the spacer layer away from the low surface energy layer, so that the first surface of the transparent elastomer layer attaches to the second surface of the spacer layer through the adhesive layer.

In some embodiments, the cover plate has a display area and a border area located outside the display area, and the transparent elastomer layer, the low surface energy layer and the spacer layer are located in both the display area and the border area, and before attaching the first surface of the transparent elastomer layer to the second surface of the spacer layer, the method further includes: forming a light-shielding layer located in the border area on the second surface of the spacer layer; and/or forming a light-shielding layer located in the border area on the first surface of the transparent elastomer layer; and/or forming a light-shielding layer located in the border area on a second surface of the transparent elastomer layer. The first surface and the second surface of the transparent elastomer layer are opposite to each other.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
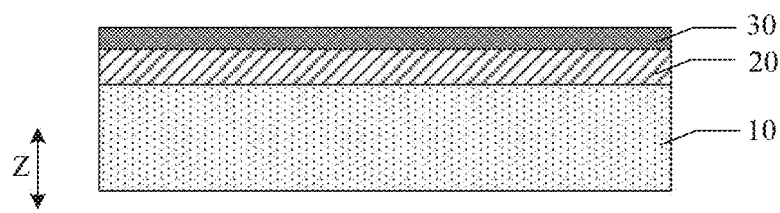
FIG. 1 is a sectional view illustration of a cover plate, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, features defined as "first" or "second" may explicitly or implicitly include one or more of the features. In the description of the embodiments of the present disclosure, the term "a plurality of/the plurality of" means two or more unless otherwise specified.

The phrase "A and/or B" includes the following three combinations: only A, only B, and a combination of A and B.

Exemplary embodiments are described herein with reference to cross-sectional views and/or plan views as idealized exemplary drawings. In the accompanying drawings, thicknesses of layers and regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but include shape deviations due to, for example, manufacturing. For example, an etched region shown in a rectangular shape generally has a curved feature. The regions shown in the accompanying drawings are schematic in nature, and their shapes are not intended to show actual shapes of a region in a device, and are not intended to limit the scope of the exemplary embodiments.

The embodiments described in the present disclosure are exemplary and are only used to explain the present disclosure, but should not be construed as limitations on the present disclosure. Where specific techniques or conditions are not indicated in the embodiments, they are performed according to the techniques or conditions described in the literature in the field or in accordance with the product specification. The reagents or instruments used without indicating the manufacturer are all conventional products that may be purchased commercially.

Some embodiments of the present disclosure provide a display device. In some embodiments, referring to FIG. 5, the display device 400 may be a flexible display device.

On this basis, in some examples, the display device 400 may be a self-luminous display device. For example, the self-luminous display device includes a plurality of current-driven light-emitting elements such as light-emitting diodes (LEDs), micro light-emitting diodes (Micro LEDs), mini light-emitting diodes (Mini LEDs), organic light-emitting diode (OLEDs) or quantum light-emitting diodes (QLEDs).

For example, the display device 400 may be any device that displays images whether moving (e.g., videos) or stationary (e.g., still images), and whether literal or graphical. More specifically, it is contemplated that the embodiments may be implemented in or associated with a variety of electronic devices. The variety of electronic devices may be (but not limited to), for example, mobile telephones, wireless devices, personal data assistants (PADs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, auto displays (e.g., odometer displays, etc.), navigators, cockpit controllers and/or displays, camera view displays (e.g., rear view camera displays in vehicles), electronic photos, electronic billboards or signages, projectors, building structures, and packaging and aesthetic structures (e.g., displays of images of a piece of jewelry).

Figure 5:
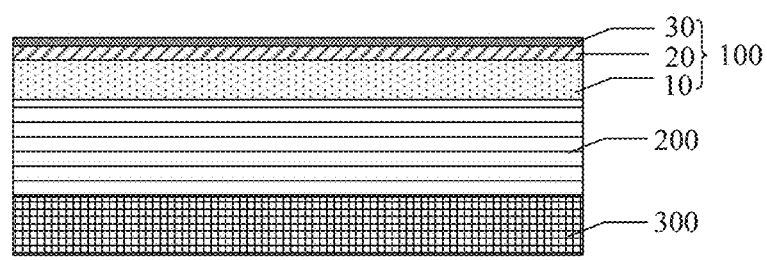
FIG. 5 is a schematic diagram of a display device, in accordance with some embodiments.

In some embodiments, as shown in FIG. 5, the display device 400 includes a display panel 200. In some examples, the display panel 200 may be a flexible display panel. For example, the display panel 200 includes the LEDs, the Micro LEDs, the Mini LEDs, the OLEDs or the QLEDs.

In some embodiments, as shown in FIG. 5, the display device 400 further includes a cover plate 100. The cover plate 100 is located on a light-exit side of the display panel 200 (e.g., a side where a display surface of the display panel 200 is located). The cover plate 100 can prevent the display panel 200 from damage (e.g., pollution or friction) caused by the external environment, so as to protect the display panel 200.

In a case where an ultra-thin glass plate (e.g., a thickness thereof is less than 0.1 mm) is used as the cover plate, the ultra-thin glass plate is easy to broken due to brittleness during use and has poor impact resistance, which will affect the performance of the display device. In a case where a transparent polyimide film (e.g., a thickness thereof is less than 0.1 mm) is used as the cover plate, the transparent polyimide film has a remarkable creep behavior, so that the transparent polyimide film may be obviously and irreversibly deformed in a high-temperature environment or under action of continuous bending stress, thereby causing the display device to be irreversibly stretched to be broken.

On this basis, some embodiments of the present disclosure provide a cover plate 100. For example, the cover plate 100 may be a flexible cover plate.

As show in FIG. 1, the cover plate 100 includes a transparent elastomer layer 10, a spacer layer 20 and a low surface energy layer 30. The low surface energy layer 30 is disposed at a side of the transparent elastomer layer 10, and the spacer layer 20 is disposed between the transparent elastomer layer 10 and the low surface energy layer 30.

For example, the spacer layer 20 is disposed on a surface of the transparent elastomer layer 10. The low surface energy layer 30 is disposed on a surface of the spacer layer 20 away from the transparent elastomer layer 10. That is, in a thickness direction of the spacer layer 20 (i.e., a direction Z in FIG. 1), the transparent elastomer layer 10 and the low surface energy layer 30 are located on opposite surfaces of the spacer layer 20.

The transparent elastomer layer 10 is made of at least one elastomer material. For example, the transparent elastomer layer 10 is made of a rubber-like material, which is able to quickly return to its original length after being repeatedly stretched at room temperature to a length greater than its original length (e.g., a length greater than 10% of its original length).

The transparent elastomer layer 10 has characteristics of softness, elasticity, low creep, which may effectively enhance impact resistance, drop resistance and elastic resilience of the cover plate 100.

A surface energy of the low surface energy layer 30 is less than a surface energy of the transparent elastomer layer 10. That is, the low surface energy layer 30 has a low surface energy, which may reduce a friction coefficient of surfaces of the low surface energy layer 30, and improve anti-fouling capability of surfaces of the low surface energy layer 30.

The spacer layer 20 plays a role of matching the transparent elastomer layer 10 and the low surface energy layer 30, so that a peeling force between the spacer layer 20 and the transparent elastomer layer 10 and a peeling force between the spacer layer 20 and the low surface energy layer 30 are both greater than a peeling force (e.g., less than 100 gram force per inch (gf/inch)) between the transparent elastomer layer 10 and the low surface energy layer 30 in a case where the transparent elastomer layer 10 and the low surface energy layer 30 are in direct contact, thereby enhancing a bonding force between the transparent elastomer layer 10 and the low surface energy layer 30.

Therefore, the cover plate 100 provided in the embodiments of the present disclosure has good impact resistance and drop resistance, and has good flatness after flexible operation (e.g., folding, bending or curling), and may avoid irreversible deformation. In addition, stresses between layers in the cover plate 100 may be reduced, and a performance of the cover plate 100 during the flexible operation may be improved, so that the display device 400 including the cover plate 100 has properties of a large deformation amount and low creep.

It will be noted that in actual use, a surface of the transparent elastomer layer 10 in the cover plate 100 away from the low surface energy layer 30 faces the display panel 200. That is, the transparent elastomer layer 10 is closer to the display panel 200 than the low surface energy layer 30 in the display device 400. In this way, when the user is facing the display device 400, the low surface energy layer 30 is closer to the user than the transparent elastomer layer 10.

In some embodiments, a Young's modulus of the transparent elastomer layer 10 is lower than a Young's modulus of the ultra-thin glass plate (up to 70 GPa), and lower than a Young's modulus of the transparent polyimide film (up to 7 GPa).

In some examples, the Young's modulus of the transparent elastomer layer 10 is in a range of 0.001 GPa to 3 GPa. For example, the Young's modulus of the transparent elastomer layer 10 may be in a range of 0.001 GPa to 0.5 GPa. For example, the Young's modulus of the transparent elastomer layer 10 may be 3 GPa, 2 GPa, 1 GPa, 0.5 GPa, 0.4 GPa, 0.3 GPa, 0.2 GPa or 0.1 GPa.

In this case, the transparent elastomer layer 10 has capabilities of softness, elasticity, and low creep, so that the cover plate 100 including the transparent elastomer layer 10 has better impact resistance, drop resistance, and flatness after the flexible operation, which may improve a protection capability of the cover plate 100, so as to reduce the damage to the display device 400.

In some embodiments, a thickness of the transparent elastomer layer 10 is in a range of 0.05 mm to 0.5 mm. For example, the thickness of the transparent elastomer layer 10 is 0.5 mm, 0.4 mm, 0.3 mm, 0.2 mm, 0.1 mm or 0.05 mm. In this case, the transparent elastomer layer 10 may have better bending and impact resistance properties, thereby avoiding a problem that the cover plate 100 is easily broken when being bent due to a large thickness of the transparent elastomer layer 10, and also avoiding a problem that an absorption capacity of the cover plate 100 to impact is reduced due to an excessively small thickness of the transparent elastomer layer 10.

In some embodiments, a material of the transparent elastomer layer 10 includes transparent silicone rubber and/or transparent urethane rubber. In this case, the impact resistance, the drop resistance, and the flatness after the flexible operation may be further improved, and a stress-relieving effect thereof may also be improved.

Figure 2:
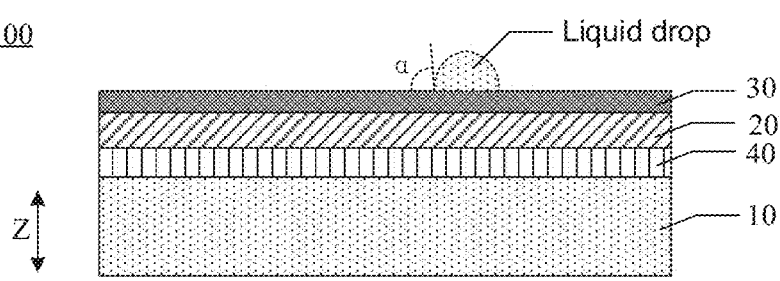
FIG. 2 is a sectional view illustration of another cover plate, in accordance with some embodiments.

In some embodiments, a contact angle of the low surface energy layer 30 (i.e., as shown in FIG. 2, a contact angle α between a liquid drop that is supplied to the low surface energy layer 30 and the low surface energy layer 30) is in a range of 1° to 110°. For example, the contact angle of the low surface energy layer 30 is 110°, 100°, 90°, 80°, 70°, 60°, 50°, 40°, 30°, 20°, 10°, 5° or 1°. In this case, the low surface energy layer 30 has a better lubricating effect and is more easily resistant to fouling, thereby reducing a friction coefficient of a surface of the cover plate 100 in contact with the outside, and improving anti-fouling capability thereof.

In some embodiments, a thickness of the low surface energy layer 30 is in a range of 0.1 μm to 20 μm. For example, the thickness of the low surface energy layer 30 is 19 μm, 15 μm, 12 μm, 10 μm or 5 μm. In this case, the low surface energy layer 30 may be prevent from being broken during the flexible operation, thereby improving the bending performance of the cover plate 100.

In some embodiments, a material of the low surface energy layer 30 includes a fluorine-containing polymer material and/or a silicon-containing polymer material. For example, the fluorine-containing polymer material includes, but is not limited to, perfluoropolyether. The silicon-containing polymer material includes, but is not limited to, silicone oil. In this case, the cover plate 100 may have a lower surface energy, so that anti-fouling capability thereof is further improved, and the friction coefficient of the surface thereof is further reduced. Furthermore, the low surface energy layer 30 has a wide range of material sources, which may reduce the production cost of the cover plate 100.

In some embodiments, a thickness of the spacer layer 20 is in a range of 1 μm to 50 μm. For example, the thickness of the spacer layer 20 is 1 μm, 5 μm, 10 μm, 15 μm, 20 μm, 25 μm, 30 μm, 35 μm, 40 μm, 45 μm or 50 μm. In this case, the spacer layer 20 may be prevent from being broken during the flexible operation, thereby improving the bending performance of the cover plate 100.

In some embodiments, a material of the spacer layer 20 includes non-elastomeric rubber and/or transparent polyethylene terephthalate. For example, the spacer layer 20 is a transparent polyimide film. In this case, the spacer layer 20 has a better matching with the transparent elastomer layer 10 and the low surface energy layer 30, and may be directly bonded to the transparent elastomer layer 10 and the low surface energy layer 30, and has a strong bonding force. Therefore, it is possible to avoid cracking of the layers in the cover plate 100, thereby improving the performance of the cover plate 100.

In addition, since the low surface energy layer 30 and the transparent elastomer layer 10 are bonded together by the spacer layer 20, there is no need to consider whether a bonding force of the material of the low surface energy layer 30 and the material of the transparent elastomer layer 10 are matched in a manufacturing process. In this way, a selection range of the material of the low surface energy layer 30 and the material of the transparent elastomer layer 10 is expanded.

It will be noted that the term "thickness" used in the embodiments of the present disclosure refers to a dimension in a direction (e.g., in the direction Z shown in FIG. 1) in which the transparent elastomer layer 10, the spacer layer 20 and the low surface energy layer 30 in the cover plate 100 are sequentially arranged.

In some embodiments, as shown in FIG. 2, the cover plate 100 further includes an adhesive layer 40. The adhesive layer 40 is located between the transparent elastomer layer 10 and the spacer layer 20.

In this case, the transparent elastomer layer 10 and the spacer layer 20 may be bonded together by the adhesive layer 40, so that a bonding force between the two layers in the cover plate 100 may be improved.

In this way, in a case where the spacer layer 20 and the transparent elastomer layer 10 are difficult to be directly bonded or the spacer layer 20 and the transparent elastomer layer 10 cannot be directly bonded, the adhesive layer 40 may ensure bonding between the spacer layer 20 and the transparent elastomer layer 10, thereby avoiding delamination or cracking between the spacer layer 20 and the transparent elastomer layer 10 during the flexible operation (e.g., folding, bending or curling) of the display device.

In addition, there is no need to consider whether a bonding force of the material of the spacer layer 20 and the material of the transparent elastomer layer 10 is matched in a manufacturing process, and a selection range of the material of the spacer layer 20 and the material of the transparent elastomer layer 10 is expanded.

For example, the material of the spacer layer 20 is the same as the material of the transparent elastomer layer 10. In this case, the cover plate 100 may have two elastomer layers made of the elastomer material, so that the cover plate 100 has good properties of a large deformation amount and low creep. In addition, each of the spacer layer 20 and the transparent elastomer layer 10 in the cover plate 100 may be set to a smaller thickness, and the spacer layer 20 is attached to the transparent elastomer layer 10 by the adhesive layer 40, so that in a process of the flexible operation of the cover plate 100, the spacer layer 20 and the transparent elastomer layer 10 may have a smaller stress, and thus a bending capability of the cover plate 100 is further enhanced.

In some examples, a material of the adhesive layer 40 includes epoxy resin adhesive, polyacrylate adhesive, polyurethane adhesive or organic silicone adhesive.

For example, a peeling force between the adhesive layer 40 and the transparent elastomer layer 10 is in a range of 500 gf/inch to 3000 gf/inch. For example, the peeling force between the adhesive layer 40 and the transparent elastomer layer 10 is greater than 800 gf/inch or less than 2000 gf/inch. In this case, the adhesive layer 40 and the transparent elastomer layer 10 have a good bonding force therebetween, so as to avoid delamination or cracking between the adhesive layer 40 and the transparent elastomer layer 10 during the flexible operation (e.g., folding, bending or curling) of the display device.

For example, a peeling force between the adhesive layer 40 and the spacer layer 20 is in a range of 500 gf/inch to 3000 gf/inch. For example, the peeling force between the adhesive layer 40 and the spacer layer 20 is greater than 800 gf/inch or less than 2000 gf/inch. In this case, the adhesive layer 40 and the spacer layer 20 have a good bonding force therebetween, which avoids delamination or cracking between the adhesive layer 40 and the spacer layer 20 during the flexible realization action (e.g., folding, bending or curling) of the display device 400.

Figure 3:
FIG. 3 is a top view illustration of a cover plate, in accordance with some embodiments.

In some embodiments, as shown in FIG. 3, the cover plate 100 has a display area AA and a border area BB located outside the display area AA. For example, the border area BB surrounds the display area AA.

In some embodiments, as shown in FIGS. 4A to 4G, the transparent elastomer layer 10, the low surface energy layer 30 and the spacer layer 20 are located in both the display area AA and the border area BB.

It can be understood that an orthogonal projection of the display area AA of the cover plate 100 on a plane perpendicular to a thickness direction of the cover plate 100 completely overlaps with an orthogonal projection of a display area of the display panel 200 on the plane, and an orthogonal projection of the border area BB of the cover plate 100 on the plane completely overlaps with an orthogonal projection of a border area of the display panel 200 on the plane.

The display area of the display panel 200 is provided with a plurality of pixels. The border area of the display panel 200 is provided with scan driving circuit(s) configured to provide scan signals to the plurality of pixels in the display area of the display panel 200, and source driver(s) configured to provide data signals to the plurality of pixels may also be bonded to the border area of the display panel 200. In this way, each pixel displays according to the received scan signal and the received data signal.

In some embodiments, as shown in FIG. 3 and FIGS. 4A to 4G, the cover plate 100 may further include at least one light-shielding layer 50. The at least one light-shielding layer 50 is located in the border area BB of the cover plate 100. For example, the light-shielding layer 50 may surround the display area AA.

In this case, the light-shielding layer 50 may shield light directed to the border area BB, so as to avoid light leakage or light interference in the display device 400, thereby improving a display effect of the display device 400.

In some examples, referring to FIG. 3, a width W of a portion of the light-shielding layer 50 located at at least one side of the display area AA in a first direction is in a range of 0.5 mm to 10 mm. For example, the width W is 0.6 mm, 0.7 mm, 0.8 mm, 1 mm, 1.5 mm, 2 mm, 3 mm, 4 mm, 5 mm, or 8 mm. The first direction is perpendicular to an extending direction of the portion of the light-shielding layer 50. For another example, a width of a portion of the light-shielding layer 50 located at each side of the display area in the first direction is in a range of 0.5 mm to 10 mm.

Figure 4A:
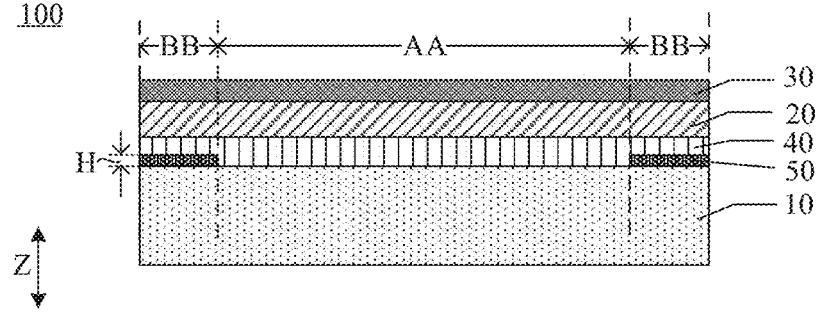
FIGS. 4A to 4G are sectional view illustrations of yet other cover plates, in accordance with some embodiments.

In some examples, referring to FIG. 4A, a thickness H of the light-shielding layer 50 (i.e., a size of the light-shielding layer 50 in the direction Z shown in FIG. 4A) is in a range of 1 µm to 10 µm. For example, the thickness of the light-shielding layer 50 is 2 µm, 3 µm, 4 µm, 5 µm, 8 µm, or 9 µm.

In some embodiments, the number of the at least one light-shielding-layer 50 is one, two or more. For example, the width of each light-shielding-layer 50 is the same, and the thickness of each light-shielding-layer 50 is also the same.

Figure 4B:
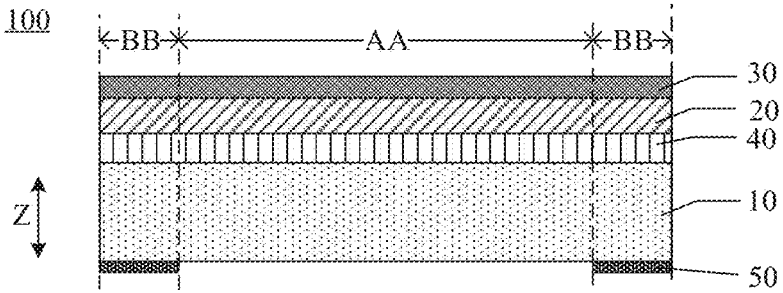
Figure 4C:
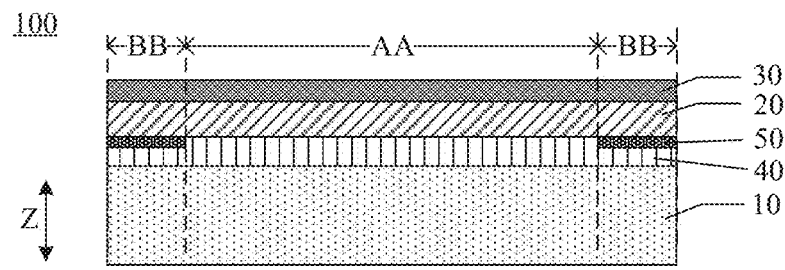

In some examples, the number of the at least one light-shielding-layer 50 is one. That is, the at least one light-shielding-layer 50 includes one light-shielding-layer 50. For example, as shown in FIG. 4B, the light-shielding layer 50 is located on a surface of the transparent elastomer layer 10 away from the low surface energy layer 30. For another example, as shown in FIG. 4A, the light-shielding layer 50 is located on a surface of the transparent elastomer layer 10 proximate to the low surface energy layer 30. For yet another example, as shown in FIG. 4C, the light-shielding layer 50 is located on a surface of the spacer layer 20 away from the low surface energy layer 30. In this way, light leakage in the display device 400 may be avoided, and a thickness of the cover plate 100 may be small.

Figure 4D:
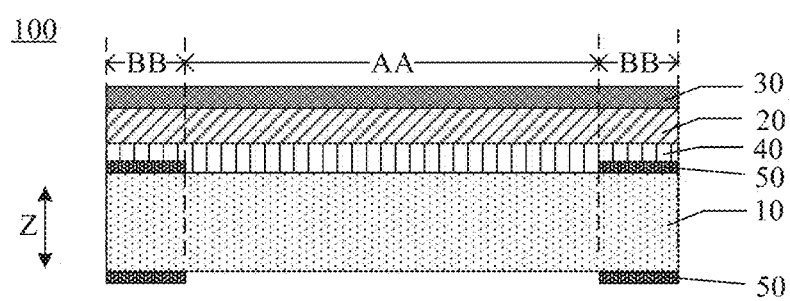
Figure 4E:
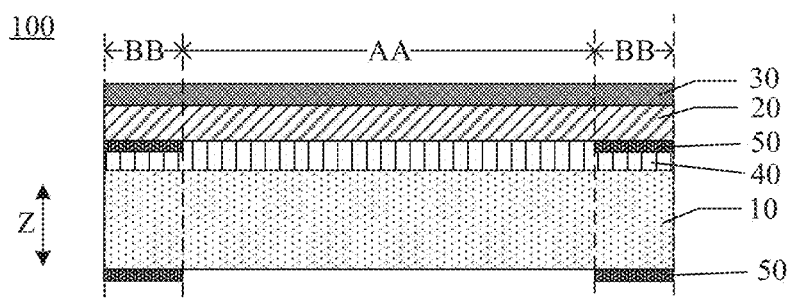
Figure 4F:
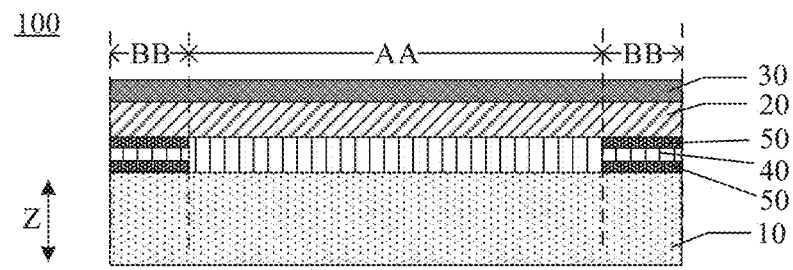

In another examples, the number of the at least one light-shielding layer 50 is two. That is, the at least one light-shielding layer 50 includes two light-shielding layers 50. For example, as shown in FIG. 4D, one of the two light-shielding layers 50 is located on a surface of the transparent elastomer layer 10 away from the low surface energy layer 30, and the other of the two light-shielding layers 50 is located on a surface of the transparent elastomer layer 10 proximate to the low surface energy layer 30. For another example, as shown in FIG. 4E, one of the two light-shielding layers 50 is located on a surface of the transparent elastomer layer 10 away from the low surface energy layer 30, and the other of the two light-shielding layers 50 is located on a surface of the spacer layer 20 away from the low surface energy layer 30. For yet another example, as shown in FIG. 4F, one of the two light-shielding layers 50 is located on a surface of the transparent elastomer layer 10 proximate to the low surface energy layer 30, and the other of the two light-shielding layers 50 is located on a surface of the spacer layer 20 away from the low surface energy layer 30. In this way, it is possible to avoid a problem that a light-shielding effect is affected due to a position shift of the light-shielding layer 50 caused by movements of the layers in the cover plate 100 in a process of bending the display device 400.

Figure 4G:
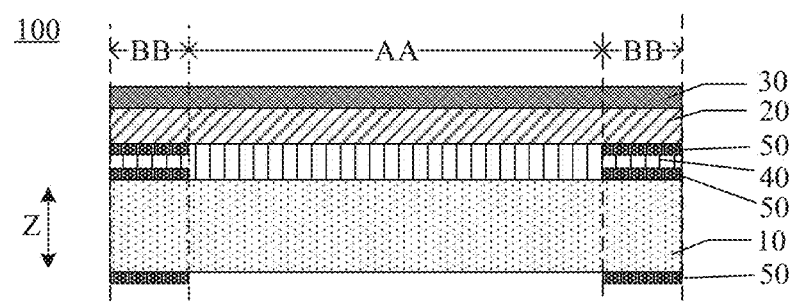

In yet other examples, the number of the at least one light-shielding-layer 50 is three. That is, the at least one light-shielding-layer 50 includes three light-shielding-layers 50. For example, as shown in FIG. 4G, one of the three light-shielding layers 50 is located on a surface of the transparent elastomer layer 10 away from the low surface energy layer 30, another one of the three light-shielding layers 50 is located on a surface of the transparent elastomer layer 10 proximate to the low surface energy layer 30, and the remaining one of the three light-shielding layers 50 is located on a surface of the spacer layer 20 away from the low surface energy layer 30. In this way, it is possible to avoid a problem that a light-shielding effect is affected due to a position shift of the light-shielding layer 50 caused by movements of the layers in the cover plate 100 in a process of bending the display device 400.

Moreover, the light-shielding layer 50 may also play a role of shielding some of internal structures of the display device 400 including the cover plate 100, so that the display device 400 may have an attractive appearance.

In some examples, the light-shielding layer may be made of ink. For example, the ink may be printed at a position where the light-shielding layer 50 is to be formed to obtain the light-shielding layer 50.

It will be noted that a color, shape and thickness of the light-shielding layer 50 are not particularly limited, and may be flexibly selected according to actual needs. For example, the color of the light-shielding layer 50 is a single color or a gradually varied color. For example, the light-shielding layer 50 has an opening or a groove.

In some embodiments, as shown in FIG. 5, the display device 400 further includes a support structure 300. The support structure 300 is disposed on a side of the display panel 200 away from the cover plate 100.

In some examples, the support structure 300 is of a structure that has a certain degree of rigidity and can be bent or curled, and is configured to support the display panel 200. For example, the support structure 300 includes a metal support, such as a metal bracket or a metal mesh. For another example, the support structure 300 is a metal layer with a small thickness (e.g., the small thickness is in a range of 5 μm to 50 μm). For yet another example, the support structure 300 is a metal layer with a large thickness (e.g., the large thickness is in a range of 100 μm to 300 μm), in which a plurality of through holes are provided. In this way, the support structure 300 may maintain a flatness of the flexible display panel 200, and when the flexible display panel 200 performs the flexible operation (e.g., folding, bending or curling), the support structure 300 may be consistent with the flexible operation of the flexible display panel 200 to improve the bending effect of the entire display device 400.

It will be noted that the cover plate 100 in the display device 400 provided in the embodiments of the present disclosure is the cover plate 100 in any of the above embodiments.

The technical effect of the display device 400 is the same as the technical effect of the cover plate 100.

Hereinafter, the performance of the display device is tested when the cover plate in the display device adopts different structures.

In Example 1, a cover plate is the cover plate 100 in FIG. 2. In the cover plate 100, the transparent elastomer layer 10 is made of transparent silica gel, and the thickness thereof is 150 μm; the spacer layer 20 is made of transparent polyurethane, and the thickness thereof is 35 μm; the low surface energy layer 30 is made of fluorine-containing polyurethane (PU) curable coating, and the thickness thereof is 15 μm; and the thickness of the adhesive layer 40 is 25 μm.

In Example 2, a cover plate is a transparent polyimide cover plate with a thickness of 90 μm.

During a high-temperature curl test, a display surface of the display device in Example 1 is faced to a reel and completely wound around the reel; and a display surface of the display device in Example 2 is faced to another reel and completely wound around the another reel. Each reel is made of stainless steel, a shape of the reel is cylindrical, and a radius of the reel is 5 mm. Then, they are left to stand for 240 hours in an environment with a temperature of 60° C. and a relative humidity (i.e., a ratio of vapor pressure of water in the air to saturated vapor pressure of water at the same temperature and pressure) of 90%.

Figure 13A:
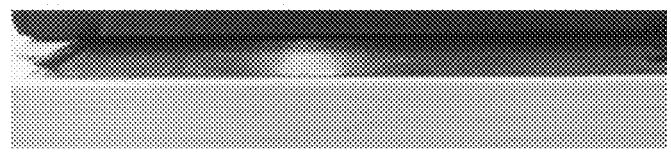
FIG. 13A is a schematic diagram of a flat state of the display device in Example 1 after a high-temperature curl test.
Figure 13B:
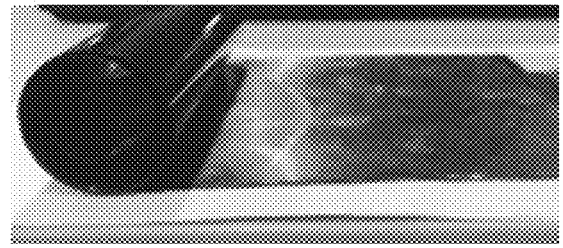
FIG. 13B is a schematic diagram of a flat state of the display device in Example 2 after a high-temperature curl test.

A result of the display device in Example 1 after the high-temperature curl test is shown in FIG. 13A, and a result of the display device in Example 2 after the high-temperature curl test is shown in FIG. 13B. It can be seen that a flatness of the display device in Example 1 after the high-temperature curl test is better than a flatness of the display device in Example 2 after the high-temperature curl test. That is, a flatness recovery performance of the display device in Example 1 after the high-temperature curl test is better than a flatness recovery performance of the display device in Example 2 after the high-temperature curl test. Therefore, compared with the display device in Example 2, the display device in Example 1 may better avoid irreversible deformation and may perform well in the process of flexible operation.

In a process of a falling ball test, a steel ball with a mass of 32.65 g is used and freely falls toward the display surface from a drop height. The drop height of the steel ball gradually rises until defective dot(s) appear in the display device. Test results can be seen in Table 1 below. In Table 1, there are four types of support structures in the display device. Type A, type B and type C are made of the same metal. A thickness of type A (e.g., 0.25 mm) is less than a thickness of type B (e.g., 0.5 mm), and the thickness of type B (e.g., 0.5 mm) is less than a thickness of type C (e.g., 1 mm). Type D is made of marble, and its thickness is greater than 5 mm.

TABLE 1

| | Types of support structure | Type A | Type B | Type C | Type D |
|---|---|---|---|---|---|
| Example 1 | Allowable drop height | >60 cm | 40 cm | 8 cm | 2 cm |
| Example 2 | Allowable drop height | 3 cm | 1 cm | 1 cm | 1 cm |

It can be seen that in a case of the same type of support structure, an allowable drop height (i.e., a maximum drop height at which defective dot(s) do not appear in the display device) of the display device 400A in Example 1 is greater than an allowable drop height of the display device 400B in Example 2. Therefore, a drop resistance and an impact resistance of the display device 400A in Example 1 are better than a drop resistance and an impact resistance of the display device 400B in Example 2.

In addition, an allowable drop height of a display device with a support structure of type A is greater than an allowable drop height of a display device with a support structure of type B, greater than an allowable drop height of a display device with a support structure of type C, and greater than an allowable drop height of a display device with a support structure of type D. Therefore, for three metal support structures of type A, type B, and type C with different thicknesses (i.e., for support structures with different thicknesses made of the same material), the support structure with a smaller thickness has better drop resistance and impact resistance.

Moreover, the metal support structures of type A, type B and type C have better drop resistance and impact resistance than the marble support structure of type D. Therefore, the support structure with greater flexibility has better drop resistance and impact resistance.

In summary, the display device with the support structure having smaller thickness and greater flexibility (e.g., the support structure of type A) has better drop resistance and impact resistance.

Figure 6:
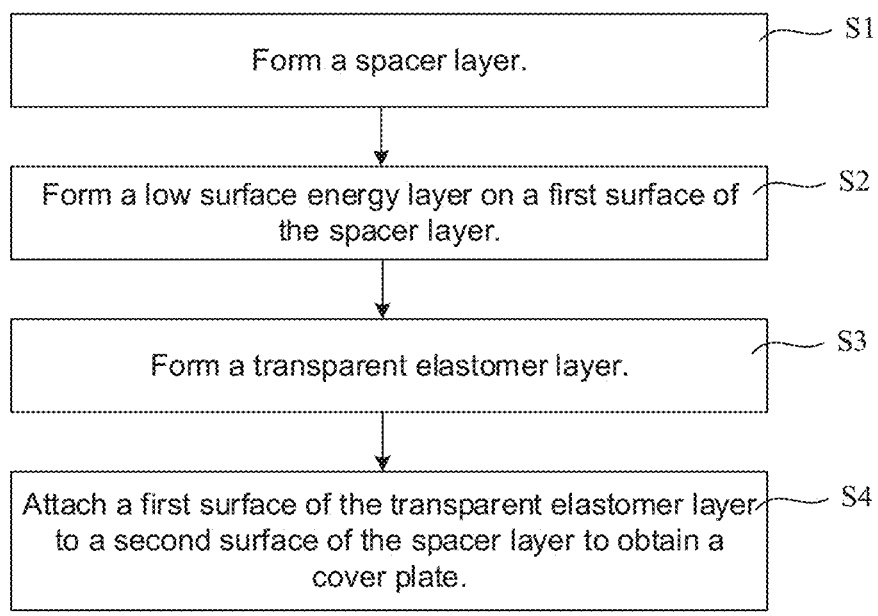
FIG. 6 is a flow chart of manufacturing a cover plate, in accordance with some embodiments.

Some embodiments of the present disclosure provide a method for manufacturing the cover plate 100 in any of the above embodiments. As shown in FIG. 6, the method includes steps 1 to 4 (S1 to S4).

In S1, the spacer layer is formed.

Figure 7A:
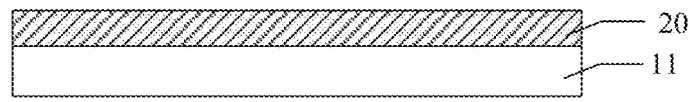
FIGS. 7A to 7D are process diagrams of manufacturing a cover plate, in accordance with some embodiments.

For example, referring to FIG. 7A, a material for forming the spacer layer 20 is coated on a first base substrate 11, and cured to obtain the spacer layer 20.

In some examples, the material for forming the spacer layer 20 includes non-elastomeric rubber, or transparent polyethylene terephthalate, or non-elastomeric rubber and transparent polyethylene terephthalate.

In S2, the low surface energy layer is formed on a first surface of the spacer layer.

Figure 7B:
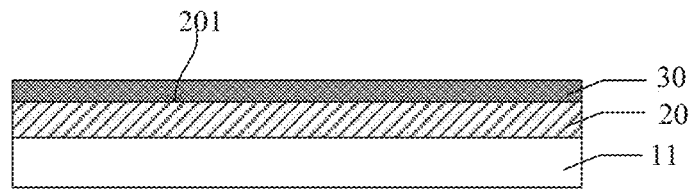

For example, referring to FIG. 7B, a material for forming the low surface energy layer 30 is coated on the first surface 201 of the spacer layer 20 (i.e., a surface of the spacer layer 20 away from the first base substrate 11), and cured to obtain the low surface energy layer 30.

In some examples, the material for forming the low surface energy layer 30 includes a fluorine-containing polymer material, or a silicon-containing polymer material, or a fluorine-containing polymer material and a silicon-containing polymer material. For example, the fluorine-containing polymer material includes perfluoropolyether, and the silicon-containing polymer material includes silicone oil.

In S3, the transparent elastomer layer is formed.

Figure 7C:
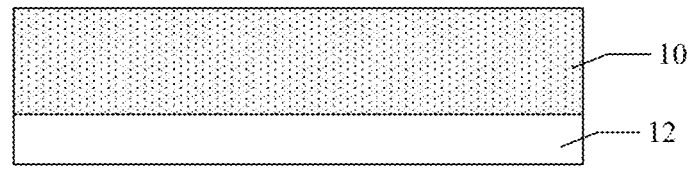

For example, referring to FIG. 7C, a material for forming the transparent elastomer layer 10 is coated on a second base substrate 12, and cured to obtain the transparent elastomer layer 10.

In some examples, the material for forming the transparent elastomer layer 10 includes transparent silicone rubber, or transparent urethane rubber, or the transparent silicone rubber and the transparent urethane rubber.

In S4, a first surface of the transparent elastomer layer is attached to a second surface of the spacer layer to obtain a cover plate.

The first surface 201 and the second surface 202 of the spacer layer 20 are opposite to each other.

Figure 7D:
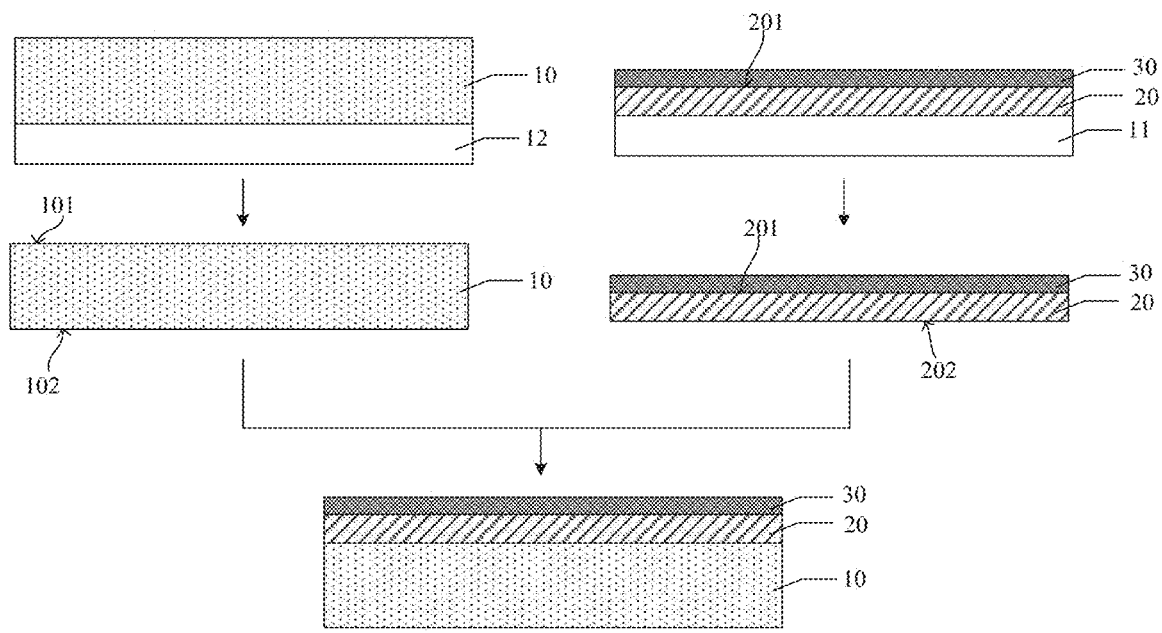

For example, as shown in FIG. 7D, the first base substrate 11 is peeled off from the spacer layer 20, and the second base substrate 12 is peeled off from the transparent elastomer layer 10. The spacer layer 20 and the transparent elastomer layer 10 are each a layer with a certain strength. Then, the first surface 101 of the transparent elastomer layer 10 is attached to the second surface 202 of the spacer layer 20 to obtain the cover plate 100.

In some examples, materials of the first base substrate 11 and the second base substrate 12 may be selected according to actual production needs, which are not limited herein. For example, the first base substrate 11 and the second base substrate 12 are flexible base substrates, such as polyimide (PI) base substrates. For another example, the first base substrate 11 and the second base substrate 12 are rigid base substrates, such as glass base substrates.

In the cover plate 100, the transparent elastomer layer 10 has characteristics of softness, elasticity, low creep, etc., which may effectively enhance impact resistance, drop resistance and elastic resilience of the cover plate 100. The low surface energy layer 30 has a low surface energy, which may reduce the friction coefficient of surfaces of the low surface energy layer 30, and improve anti-fouling capability of surfaces of the low surface energy layer 30. The spacer layer 20 plays a role of matching the transparent elastomer layer 10 and the low surface energy layer 30, so that a peeling force (e.g., greater than 800 gf/inch) between the spacer layer 20 and the transparent elastomer layer 10 and a peeling force (e.g., greater than 800 gf/inch) between the spacer layer 20 and the low surface energy layer 30 are both greater than a peeling force (e.g., less than 100 gf/inch) between the transparent elastomer layer 10 and the low surface energy layer 30 in a case where the transparent elastomer layer 10 and the low surface energy layer 30 are in direct contact, thereby enhancing a bonding force between the transparent elastomer layer 10 and the low surface energy layer 30.

Therefore, the cover plate 100 obtained by the method provided in the embodiments of the present disclosure has good impact resistance, strong drop resistance, and good flatness after flexible operation (e.g., folding, bending or curling), and may avoid irreversible deformation. In addition, stresses between layers in the cover plate 100 may be reduced, and a performance of the cover plate 100 during the flexible operation may be improved, so that the display device 400 including the cover plate 100 has properties of a large deformation amount and low creep. Moreover, the surface friction coefficient of the cover plate 100 may be reduced, and anti-fouling capability of the cover plate 100 may be improved, which is beneficial to prolonging a life span of the cover plate 100.

In some embodiments, for mass production of a plurality of cover plates 100, the material for forming the spacer layer 20 may be coated on a first mother board and cured to obtain a spacer film, and the material for forming the low surface energy layer 30 may be coated on the spacer film and cured to obtain a low surface energy film, and the first mother board is peeled off to obtain a first film structure including the spacer film and the low surface energy film; the material for forming the transparent elastomer layer 10 is coated on a second mother board and cured to obtain a transparent elastomer film, and the second mother board is peeled off to obtain a second film structure including the transparent elastomer film; a surface of the spacer film away from the low surface energy film in the first film structure and a first surface of the transparent elastomer film in the second film structure are attached to obtain a cover plate mother board; then, the cover plate mother board is cut to obtain the plurality of cover plates 100. Each cover plate 100 includes the low surface energy layer 30, the transparent elastomer layer 10, and the spacer layer 20 located between the low surface energy layer 30 and the transparent elastomer layer 10.

In some embodiments, before attaching the first surface 101 of the transparent elastomer layer 10 to the second surface 202 of the spacer layer 20, the method further includes forming an adhesive layer 40 on the second surface 202 of the spacer layer 20 away from the low surface energy layer 30, so that the first surface 101 of the transparent elastomer layer 10 attaches to the second surface 202 of the spacer layer 20 through the adhesive layer 40.

In some examples, a material for forming the adhesive layer 40 is epoxy resin adhesive, polyacrylate adhesive, polyurethane adhesive or silicone adhesive.

Figure 8:
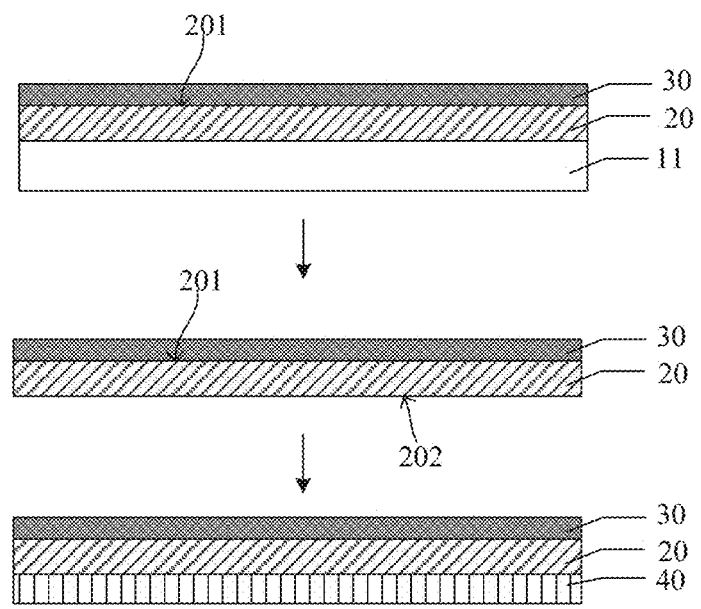
FIG. 8 is a process diagram of manufacturing an adhesive layer of a cover plate, in accordance with some embodiments.

For example, referring to FIG. 8, the first base substrate 11 is peeled off from the spacer layer 20, and then the material for forming the adhesive layer 40 is coated on the surface of the spacer layer 20 away from the low surface energy layer 30 (i.e., on the second surface 202 of the spacer layer 20), so as to form the adhesive layer 40.

For example, in a process of manufacturing the cover plate mother board, the material for forming the adhesive layer 40 is coated on the surface of the spacer film away from the low surface energy film to form a bonding film. After that, the surface of the spacer film away from the low surface energy film in the first film structure and the first surface of the transparent elastomer film in the second film structure are attached through the bonding film to obtain the cover plate mother board. On this basis, after the cover plate mother board is cut, each cover plate 100 includes the low surface energy layer 30, the transparent elastomer layer 10, the spacer layer 20 located between the low surface energy layer 30 and the transparent elastomer layer 10, and the adhesive layer 40 located between the spacer layer 20 and the transparent elastomer layer 10.

In some embodiments, referring to FIGS. 4A to 4G, the cover plate 100 has the display area AA and the border area BB, and the transparent elastomer layer 10, the low surface energy layer 30 and the spacer layer 20 are located in both the display area AA and the border area BB. Before attaching the first surface 101 of the transparent elastomer layer 10 to the second surface 202 of the spacer layer 20, the method includes: forming a light-shielding layer 50 in the border area BB on the second surface 202 of the spacer layer 20;

and/or forming a light-shielding layer 50 in the border area BB on the first surface 101 of the transparent elastomer layer 10; and/or forming a light-shielding layer 50 in the border area BB on the second surface 102 of the transparent elastomer layer 10.

The first surface 101 and the second surface 102 of the transparent elastomer layer 10 are opposite to each other.

Figure 9:
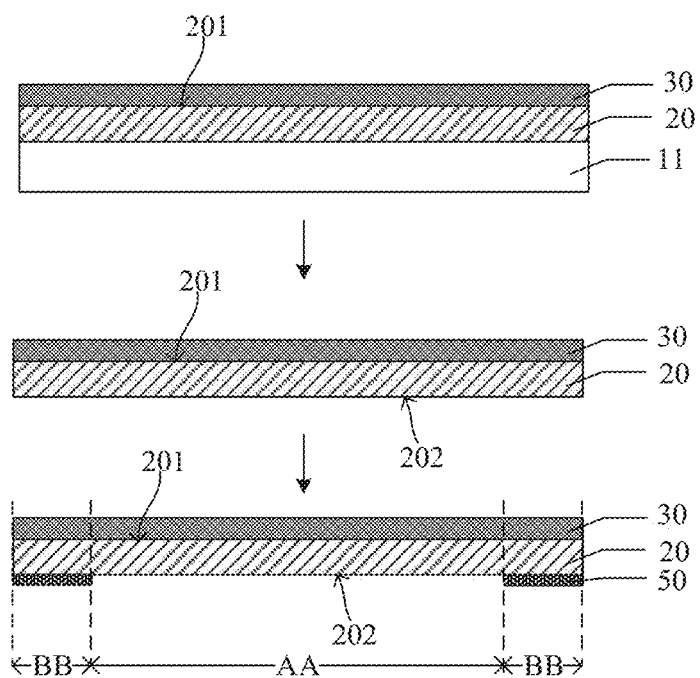
FIG. 9 is a process diagram of manufacturing a light-shielding layer of a cover plate, in accordance with some embodiments.
Figure 10:
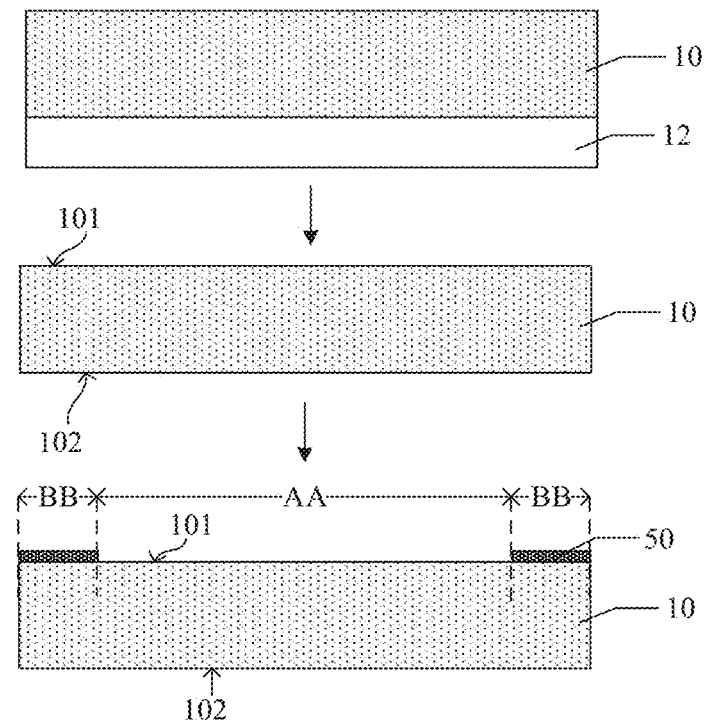
FIG. 10 is a process diagram of manufacturing another light-shielding layer of a cover plate, in accordance with some embodiments.
Figure 11:
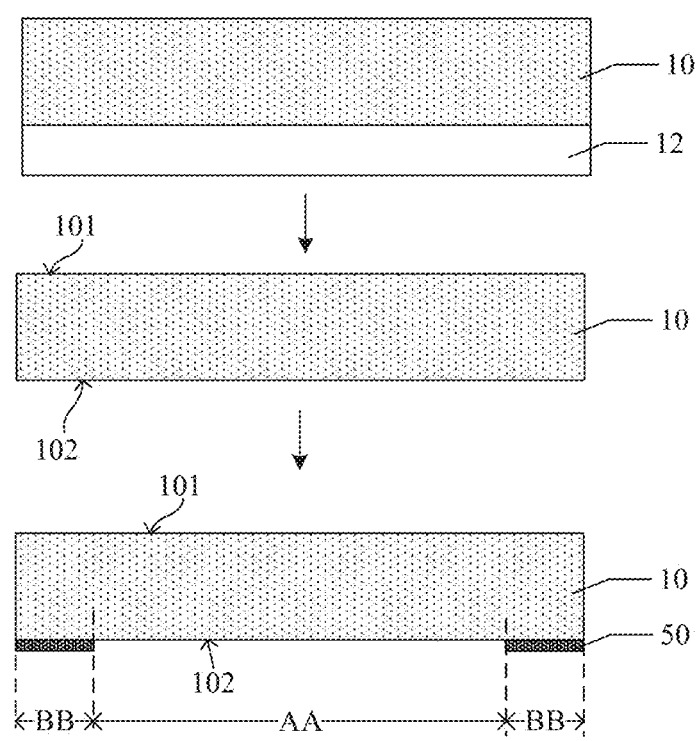
FIG. 11 is a process diagram of manufacturing yet another light-shielding layer of a cover plate, in accordance with some embodiments.

In some examples, before attaching the first surface 101 of the transparent elastomer layer 10 to the second surface 202 of the spacer layer 20, referring to FIG. 9, the material for forming the light-shielding layer 50, e.g., ink, is printed on the second surface 202 of the spacer layer 20 to obtain the light-shielding layer 50; or referring to FIG. 10, the material for forming the light-shielding layer 50 may be printed on the first surface 101 of the transparent elastomer layer 10 to obtain the light-shielding layer 50; or referring to FIG. 11, the material for forming the light-shielding layer 50 may be printed on the second surface 102 of the transparent elastomer layer 10 to obtain the light-shielding layer 50. The light-shielding layer 50 is located at the border area BB other than the display area AA of the cover plate 100.

Figure 12:
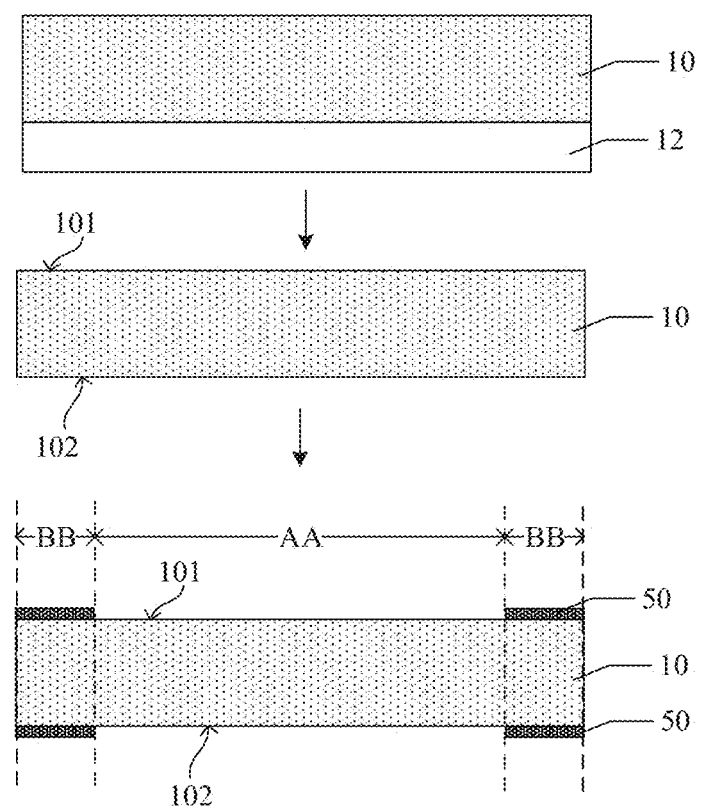
FIG. 12 is a process diagram of manufacturing yet another light-shielding layer of a cover plate, in accordance with some embodiments.

In another examples, before attaching the first surface 101 of the transparent elastomer layer 10 to the second surface 202 of the spacer layer 20, referring to FIGS. 9 and 10, the material for forming light-shielding layer 50 may be printed on the second surface 202 of the spacer layer 20 and on the first surface 101 of the transparent elastomer layer 10 to obtain the light-shielding layers 50; or referring to FIGS. 9 and 11, the material for forming the light-shielding layer 50 may be printed on the second surface 202 of the spacer layer 20 and on the second surface 102 of the transparent elastomer layer 10 to obtain the light-shielding layers 50; or referring to FIG. 12, the material for forming the light-shielding layer 50 may be printed on the first surface 101 and the second surface 102 of the transparent elastomer layer 10 to obtain the light-shielding layers 50. In this case, the number of light-shielding layers 50 in the cover plate 100 is two.

In yet another examples, before attaching the first surface 101 of the transparent elastomer layer 10 to the second surface 202 of the spacer layer 20, referring to FIGS. 9 and 12, the material for forming the light-shielding layer 50 may be printed on the second surface 202 of the spacer layer 20 and on the first surface 101 and the second surface 102 of the transparent elastomer layer 10 to obtain the light-shielding layers 50. In this case, the number of light-shielding layers 50 in the cover plate 100 is three.

For example, in a process of manufacturing the cover plate mother board, a material for forming the light-shielding layer 50 is coated on the surface of the spacer film away from the low surface energy film to form a light-shielding film; or the material for forming the light-shielding layer 50 is coated on the first surface of the transparent elastomer film to form a light-shielding film; or the material for forming the light-shielding layer 50 is coated on a second surface of the transparent elastomer film to form a light-shielding film. After that, the light-shielding film is patterned to remove portions of the light-shielding film located at the display areas of the cover plates 100 to be formed. On this basis, after the cover plate mother board is cut, each cover plate 100 further includes light-shielding layer 50.

In some embodiments, in a case where the light-shielding layer 50 is formed on the surface of the spacer layer 20 away from the low surface energy layer 30 (i.e., the second surface 202), the material for forming the adhesive layer 40 may be coated on the surface of the spacer layer 20 away from the low surface energy layer 30 to form the adhesive layer 40, and the adhesive layer 40 covers the light-shielding layer 50. After that, the surface of the spacer layer 20 away from the low surface energy layer 30 is attached to the first surface 101 of the transparent elastomer layer 10 through the adhesive layer 40, so as to obtain the cover plate 100.

For example, in a case where the light-shielding layer 50 is formed on the first surface 101 of the transparent elastomer layer 10, a surface of the light-shielding layer 50 away from the transparent elastomer layer 10 is also attached to the spacer layer 20 or the adhesive layer 40.

The method for manufacturing the cover plate 100 has the same technical effects as the cover plate 100, which will not be repeated herein.

Although the embodiments of the present disclosure have been shown and described above, it will be understood that the above embodiments are exemplary and not to be construed as limitations on the present disclosure, and that changes, amendments, substitutions and modifications may be made to the above embodiments by those of ordinary skill in the art within the scope of the present disclosure.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A cover plate, comprising:
   a transparent elastomer layer being made of at least one elastomer material;
   a low surface energy layer disposed at a side of the transparent elastomer layer, wherein a surface energy of the low surface energy layer is less than a surface energy of the transparent elastomer layer; and
   a spacer layer disposed between the transparent elastomer layer and the low surface energy layer, the spacer layer being in contact with the transparent elastomer layer and the spacer layer being in contact with the low surface energy layer, and the spacer layer being configured to match the transparent elastomer layer and the low surface energy layer to enhance a bonding force between the transparent elastomer layer and the low surface energy layer.

2. The cover plate according to claim 1, wherein a Young's modulus of the transparent elastomer layer is in a range of 0.001 GPa to 3 GPa.

3. The cover plate according to claim 1, wherein a thickness of the transparent elastomer layer is in a range of 0.05 mm to 0.5 mm; and/or
   a material of the transparent elastomer layer includes transparent silicone rubber and/or transparent urethane rubber.

4. The cover plate according to claim 1, wherein a contact angle of the low surface energy layer is in a range of 1° to 110°; and/or
   a thickness of the low surface energy layer is in a range of 0.1 μm to 20 μm; and/or
   a material of the low surface energy layer includes a fluorine-containing polymer material and/or a silicon-containing polymer material.

5. The cover plate according to claim 1, wherein a thickness of the spacer layer is in a range of 1 μm to 50 μm; and/or a material of the spacer layer includes non-elastomeric rubber and/or transparent polyethylene terephthalate.

6. The cover plate according to claim 1, wherein the cover plate has a display area and a border area located outside the display area; and the cover plate further comprises at least one light-shielding layer located in the border area.

7. The cover plate according to claim 6, wherein the transparent elastomer layer, the low surface energy layer and the spacer layer are located in both the display area and the border area;
the at least one light-shielding layer includes one light-shielding layer, wherein
the light-shielding layer is disposed on a surface of the transparent elastomer layer away from the low surface energy layer; or
the light-shielding layer is disposed on a surface of the transparent elastomer layer proximate to the low surface energy layer; or
the light-shielding layer is disposed on a surface of the spacer layer away from the low surface energy layer.

8. The cover plate according to claim 6, wherein the transparent elastomer layer, the low surface energy layer and the spacer layer are located in both the display area and the border area;
the at least one light-shielding layer includes two light-shielding layers, wherein
the two light-shielding layers are disposed on surfaces of the transparent elastomer layer proximate to and away from the low surface energy layer, or
the two light-shielding layers are disposed on a surface of the transparent elastomer layer away from the low surface energy layer and a surface of the spacer layer away from the low surface energy layer; or
the two light-shielding layers are disposed on a surface of the transparent elastomer layer proximate to the low surface energy layer and a surface of the spacer layer away from the low surface energy layer.

9. The cover plate according to claim 6, wherein the transparent elastomer layer, the low surface energy layer and the spacer layer are located in both the display area and the border area;
the at least one light-shielding layer includes three light-shielding layers; one of the three light-shielding layers is disposed on a surface of the spacer layer away from the low surface energy layer, and another two of the three light-shielding layers are displayed on surfaces of the transparent elastomer layer proximate to and away from the low surface energy layer.

10. A display device, comprising:
a display panel; and
the cover plate according to claim 1, the cover plate being disposed on a light-exit side of the display panel.

11. A method for manufacturing the cover plate according to claim 1, the method comprising:
forming the spacer layer;
forming the low surface energy layer on a first surface of the spacer layer;
forming the transparent elastomer layer; and
attaching a first surface of the transparent elastomer layer to a second surface of the spacer layer to obtain the cover plate, wherein
the first surface and the second surface of the spacer layer are opposite to each other.

12. The method according to claim 11, wherein before attaching the first surface of the transparent elastomer layer to the second surface of the spacer layer, the method further comprises: forming an adhesive layer on the second surface of the spacer layer away from the low surface energy layer, so that the first surface of the transparent elastomer layer attaches to the second surface of the spacer layer through the adhesive layer.

13. The method according to claim 11, wherein the cover plate has a display area and a border area located outside the display area, and the transparent elastomer layer, the low surface energy layer and the spacer layer are located in both the display area and the border area; and before attaching the first surface of the transparent elastomer layer to the second surface of the spacer layer, the method further comprises:
forming a light-shielding layer located in the border area on the second surface of the spacer layer; and/or
forming a light-shielding layer located in the border area on the first surface of the transparent elastomer layer; and/or
forming a light-shielding layer located in the border area on a second surface of the transparent elastomer layer, wherein the first surface and the second surface of the transparent elastomer layer are opposite to each other.

14. A cover plate having a display area and a border area located outside the display area, comprising:
a transparent elastomer layer being made of at least one elastomer material;
a low surface energy layer disposed at a side of the transparent elastomer layer, wherein a surface energy of the low surface energy layer is less than a surface energy of the transparent elastomer layer;
a spacer layer disposed between the transparent elastomer layer and the low surface energy layer, the spacer layer being in contact with the transparent elastomer layer and the spacer layer being in contact with the low surface energy layer; and
one or more light-shielding layers located in the border area, wherein
the transparent elastomer layer, the low surface energy layer and the spacer layer are located in both the display area and the border area, and
at least one light-shielding layer of the one or more light-shielding layers is disposed between the transparent elastomer layer and the spacer layer.

15. The cover plate according to claim 14, wherein the one or more light-shielding layers include one light-shielding layer, wherein
the light-shielding layer is disposed on a surface of the transparent elastomer layer proximate to the low surface energy layer; or
the light-shielding layer is disposed on a surface of the spacer layer away from the low surface energy layer.

16. The cover plate according to claim 14, wherein the one or more light-shielding layers include two light-shielding layers, wherein
the two light-shielding layers are disposed on surfaces of the transparent elastomer layer proximate to and away from the low surface energy layer, or
the two light-shielding layers are disposed on a surface of the transparent elastomer layer away from the low surface energy layer and a surface of the spacer layer away from the low surface energy layer; or
the two light-shielding layers are disposed on a surface of the transparent elastomer layer proximate to the low surface energy layer and a surface of the spacer layer away from the low surface energy layer.

17. The cover plate according to claim 14, wherein the one or more light-shielding layers include three light-shielding layers; one of the three light-shielding layers is disposed on a surface of the spacer layer away from the low surface energy layer, and another two of the three light-shielding layers are displayed on surfaces of the transparent elastomer layer proximate to and away from the low surface energy layer.

18. A cover plate, comprising:
a transparent elastomer layer being made of at least one elastomer material;
a low surface energy layer disposed at a side of the transparent elastomer layer, wherein a surface energy of the low surface energy layer is less than a surface energy of the transparent elastomer layer;
a spacer layer disposed between the transparent elastomer layer and the low surface energy layer, the spacer layer being in contact with the low surface energy layer; and
an adhesive layer disposed between the transparent elastomer layer and the spacer layer, wherein
a peeling force between the adhesive layer and the transparent elastomer layer is in a range of 500 gf/inch to 3000 gf/inch; and
a peeling force between the adhesive layer and the spacer layer is in a range of 500 gf/inch to 3000 gf/inch.

* * * * *